(12) United States Patent
Bedell et al.

(10) Patent No.: US 8,748,296 B2
(45) Date of Patent: Jun. 10, 2014

(54) EDGE-EXCLUSION SPALLING METHOD FOR IMPROVING SUBSTRATE REUSABILITY

(75) Inventors: Stephen W. Bedell, Wappingers Falls, NY (US); Keith E. Fogel, Hopewell Junction, NY (US); Paul A. Lauro, Brewster, NY (US); Devendra K. Sadana, Pleasantville, NY (US); Davood Shahrjerdi, Ossining, NY (US); Norma E. Sosa Cortes, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 295 days.

(21) Appl. No.: 13/172,793

(22) Filed: Jun. 29, 2011

(65) Prior Publication Data

US 2013/0005116 A1 Jan. 3, 2013

(51) Int. Cl.
*H01L 21/00* (2006.01)

(52) U.S. Cl.
USPC ........ 438/462; 438/94; 438/96; 257/E21.211; 257/E31.019; 257/E31.004

(58) Field of Classification Search
USPC .......... 438/458–462; 257/E21.211, E31.004, 257/E31.019
See application file for complete search history.

(56) References Cited

U.S. PATENT DOCUMENTS

| | | | |
|---|---|---|---|
| 4,582,559 A | 4/1986 | Tanielian et al. | |
| 2007/0249140 A1* | 10/2007 | Dross et al. | 438/458 |
| 2010/0307572 A1* | 12/2010 | Bedell et al. | 136/255 |
| 2010/0310775 A1 | 12/2010 | Bedell et al. | |

FOREIGN PATENT DOCUMENTS

WO WO2010144202 A1 12/2010

OTHER PUBLICATIONS

Search and Examination Report dated Oct. 9, 2012, issued by the U.K. Intellectual Property Office, received in a corresponding foreign application.

* cited by examiner

*Primary Examiner* — Charles Garber
*Assistant Examiner* — Abdulfattah Mustapha
(74) *Attorney, Agent, or Firm* — Scully, Scott, Murphy & Presser, P.C.; Louis J. Percello, Esq.

(57) ABSTRACT

A method to minimize edge-related substrate breakage during spalling using an edge-exclusion region where the stressor layer is either non-present (excluded either during deposition or removed afterwards) or present but significantly non-adhered to the substrate surface in the exclusion region is provided. In one embodiment, the method includes forming an edge exclusion material on an upper surface and near an edge of a base substrate. A stressor layer is then formed on exposed portions of the upper surface of the base substrate and atop the edge exclusion material, A portion of the base substrate that is located beneath the stressor layer and which is not covered by the edge exclusion material is then spalled.

23 Claims, 6 Drawing Sheets

US 8,748,296 B2

EDGE-EXCLUSION SPALLING METHOD FOR IMPROVING SUBSTRATE REUSABILITY

BACKGROUND

The present disclosure relates to semiconductor device manufacturing, and more particularly to a method to minimize edge-related substrate breakage during spalling.

Surface layer removal from brittle substrates using controlled spalling technology is promising to be a powerful method for changing the cost structure of high-efficiency photovoltaic materials, as well as enabling new features in a range of semiconductor technologies (e.g., flexible photovoltaics, flex circuits and displays). Cornerstone to this technology is the application of a tensile stressor layer on the surface of a base substrate to be spalled. The tensile stressor layer has a combined thickness and stress that is sufficient to induce spalling mode fracture in the base substrate. Such a spalling process is disclosed, for example, in U.S. Patent Application Publication No. 2010/0311250 to Bedell et al.

Experimentation in spalling seems to indicate that it is a critical phenomenon; given a sufficiently high thickness and stress value in the tensile stressor layer, spalling mode fracture occurs spontaneously. There is, however, a reasonably large process window of metastability. Stressor thickness and stress combinations that are unstable against spalling mode fracture will be "nucleation-" or "initiated-limited".

Handling layers that are applied to the surface of the stress/substrate combination are then used to control the initiation and fracture propagation leading to the removal of continuous surface layers from the base substrate.

Spalling offers a low cost, simple approach for removing many thin semiconductor layers from a comparatively expensive thick base substrate. In order to maximize the reuse of the base substrate, it is important to minimize wafer breakage or any uncontrolled fracture in the stressor layer/base substrate system.

SUMMARY

The present disclosure provides a method to minimize edge-related substrate breakage during spalling using an edge-exclusion region where the stressor layer is either non-present (excluded either during deposition or removed afterwards) or present but significantly non-adhered to the substrate surface in the exclusion region.

In one embodiment of the present disclosure, the method includes forming an edge exclusion material on an upper surface and near edges of a base substrate. A stressor layer is then formed on exposed portions of the upper surface of the base substrate and atop the edge exclusion material. A portion of the base substrate that is located beneath the stressor layer and which is not covered by the edge exclusion material is then spalled.

In another embodiment of the present disclosure, the method includes forming a patterned stressor layer on a portion of an upper surface of a base substrate, wherein edges of the base substrate are exposed; and spalling a portion of the base substrate that is located beneath the patterned stressor layer.

DETAILED DESCRIPTION

Figure 1:
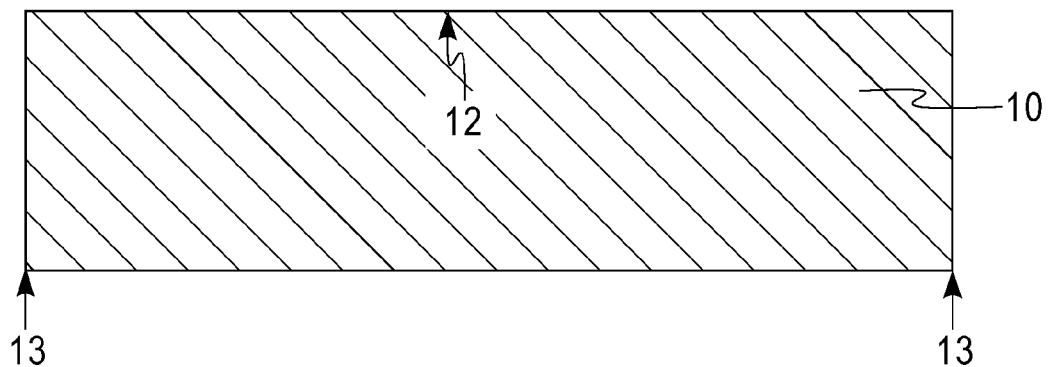
FIG. 1 is a pictorial representation (through a cross sectional view) illustrating an initial base substrate that can be employed in one embodiment of the present disclosure.

The present disclosure, which provides a method to minimize edge-related substrate breakage during spalling, will now be described in greater detail by referring to the following discussion and drawings that accompany the present application. It is noted that the drawings are provided for illustrative purposes only and are not drawn to scale. Also, in the drawings like reference numerals are used for describing like elements.

In the following description, numerous specific details are set forth, such as particular structures, components, materials, dimensions, processing steps and techniques, in order to illustrate the present disclosure. However, it will be appreciated by one of ordinary skill in the art that various embodiments of the present disclosure may be practiced without these, or with other, specific details. In other instances, well-known structures or processing steps have not been described in detail in order to avoid obscuring the various embodiments of the present disclosure.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Referring first to FIGS. 1-6, there is illustrated an embodiment of the present disclosure in which an edge exclusion material is used to define an edge exclusion region atop the base substrate. The term "edge exclusion region" is used throughout the present disclosure to denote an area atop the base substrate in which a subsequently formed stressor layer is either not present or if, present, the stressor layer does not significantly adhere to the upper surface of the base substrate. The formation of the edge exclusion region minimizes edge-related substrate breakage during spalling.

Specifically, FIG. 1 illustrates a base substrate 10 having an upper (i.e., topmost) surface 12 and a lower (i.e., bottommost) surface (not labeled) that can be employed in the present disclosure. The base substrate 10 also includes sidewall edges 13. The base substrate 10 employed in the present disclosure may comprise a semiconductor material, a glass, a ceramic, or any another material whose fracture toughness is less than that of the stressor layer to be subsequently formed.

Fracture toughness is a property which describes the ability of a material containing a crack to resist fracture. Fracture toughness is denoted $K_{Ic}$. The subscript Ic denotes mode I crack opening under a normal tensile stress perpendicular to the crack, and c signifies that it is a critical value. Mode I fracture toughness is typically the most important value because spalling mode fracture usually occurs at a location in the substrate where mode II stress (shearing) is zero, and mode III stress (tearing) is generally absent from the loading conditions. Fracture toughness is a quantitative way of expressing a material's resistance to brittle fracture when a crack is present.

When the base substrate 10 comprises a semiconductor material, the semiconductor material may include, but is not limited to, Si, Ge, SiGe, SiGeC, SiC, Ge alloys, GaSb, GaP, GaAs, InAs, InP, and all other III-V or II-VI compound semiconductors. In some embodiments, the base substrate 10 is a bulk semiconductor material. In other embodiments, the base substrate 10 may comprise a layered semiconductor material such as, for example, a semiconductor-on-insulator or a semiconductor on a polymeric substrate. Illustrated examples of semiconductor-on-insulator substrates that can be employed as base substrate 10 include silicon-on-insulators and silicon-germanium-on-insulators.

When the base substrate 10 comprises a semiconductor material, the semiconductor material can be doped, undoped or contain doped regions and undoped regions.

In one embodiment, the semiconductor material that can be employed as the base substrate 10 can be single-crystalline (i.e., a material in which the crystal lattice of the entire sample is continuous and unbroken to the edges of the sample, with no grain boundaries). In another embodiment, the semiconductor material that can be employed as the base substrate 10 can be polycrystalline (i.e., a material that is composed of many crystallites of varying size and orientation; the variation in direction can be random (called random texture) or directed, possibly due to growth and processing conditions). In yet another embodiment of the present disclosure, the semiconductor material that can be employed as the base substrate 10 can be amorphous (i.e., a non-crystalline material that lacks the long-range order characteristic of a crystal). Typically, the semiconductor material that can be employed as the base substrate 10 is a single-crystalline material.

When the base substrate 10 comprises a glass, the glass can be an $SiO_2$-based glass which may be undoped or doped with an appropriate dopant. Examples of $SiO_2$-based glasses that can be employed as the base substrate 10 include undoped silicate glass, borosilicate glass, phosphosilicate glass, fluorosilicate glass, and borophosphosilicate glass.

When the base substrate 10 comprises a ceramic, the ceramic is any inorganic, non-metallic solid such as, for example, an oxide including, but not limited to, alumina, beryllia, ceria and zirconia, a non-oxide including, but not limited to, a carbide, a boride, a nitride or a silicide; or composites that include combinations of oxides and non-oxides.

In some embodiments of the present disclosure, the upper surface 12 of the base substrate 10 can be cleaned prior to further processing to remove surface oxides and/or other contaminants therefrom. In one embodiment of the present disclosure, the base substrate 10 is cleaned by applying to the base substrate 10 a solvent such as, for example, acetone and isopropanol, which is capable of removing contaminates and/or surface oxides from the upper surface 12 of the base substrate 10.

Figure 2:
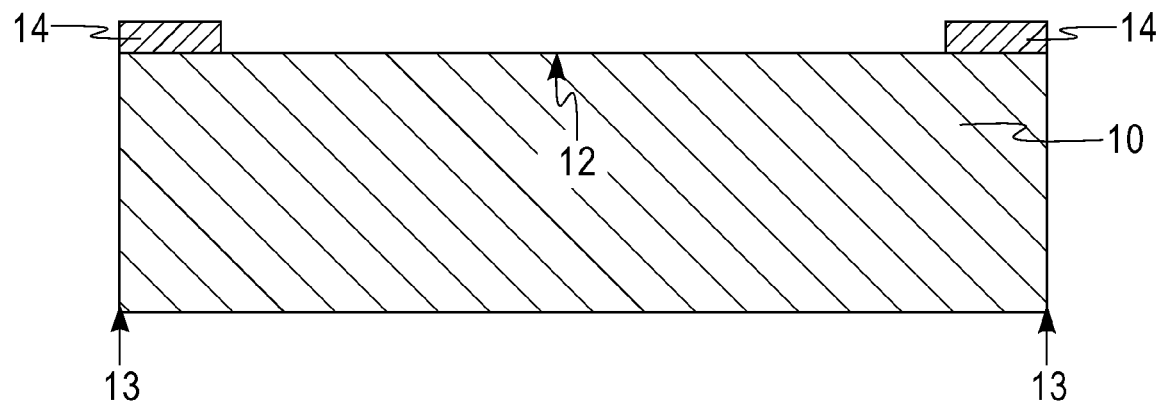
FIG. 2 is a pictorial representation (through a cross sectional view) illustrating the initial base substrate after providing an edge exclusion material on an upper surface, and at the edges of, the base substrate in accordance with one embodiment of the present disclosure.

Referring to FIG. 2, there is illustrated the structure of FIG. 1 after providing an edge exclusion material 14 on the upper surface 12, and at the edges 13 of, the base substrate 10 in accordance with one embodiment of the present disclosure. As shown, the edge exclusion material 14 has one edge that is vertical coincident with edge 13 of the base substrate 10, while another edge of the edge exclusion material 14 is located inward from edge 13 and on the upper surface 12 of the base substrate 10.

In one embodiment of the present disclosure, the edge exclusion material 14 can be an adhesion demoter. By "adhesion demoter" it is meant any material that reduces the ability of a subsequently formed optional metal-containing adhesion layer or stressor layer to adhere, i.e., stick, to the upper surface 12 of the base substrate 10. The adhesion demoters that can be employed in the present disclosure as the edge exclusion material 14 include, but are not limited, to photoresist materials, polymers, hydrocarbon materials, inks, powders, pastes or non-adherent metals such as gold. In one embodiment, the adhesion demoter that can be employed in the present disclosure as the edge exclusion material 14 is an ink.

The photoresist materials that can be employed as the adhesion demoter include any well known positive-tone materials and/or negative-tone materials.

The polymers that can be employed as the adhesion demoter include, but are not limited to, natural polymers such as rubbers, shellac, cellulose, synthetic polymers such as nylon, polyethylene and polypropylene, deposited or applied in the form of tape or film.

The hydrocarbon materials that can be employed as the adhesion demoter include, but are not limited to, saturated hydrocarbons (i.e., alkanes), unsaturated hydrocarbons (i.e., alkenes or alkynes), cycloalkanes, and aromatic hydrocarbons (i.e., arenes).

Inks that can be employed as the adhesion demoter include, but are not limited to, alcohol or water-based inks commonly found in commercial permanent markers or inks used in bubble-jet printing technology.

Metallic layers that can be employed as the adhesion demoter include, but are not limited to, Au, Ag, solders or low-melting point alloys.

Pastes that can be employed as the adhesion demoter include, but are not limited to, metal based pastes, partially-cured epoxies, vacuum grease or similar materials.

The adhesion demoters that can be employed in the present disclosure as the edge exclusion material 14 can be formed onto the upper surface 12 of the base substrate 10 near edges 13 utilizing techniques that are well known in the art. For example, the adhesion demoters that can be employed in the present disclosure as the edge exclusion material 14 can be formed by chemical vapor deposition, plasma enhanced chemical vapor deposition, atomic layer deposition, spin-coating, brushing, spray coating, screen-printing, bubble-jet printing, or fabric-tip application. In some embodiments in which inks are employed as the adhesion demoters, the ink can be applied from a pen or marker containing the same.

In one embodiment, the edge exclusion material 14 has a width, which is determined from one sidewall edge to another sidewall edge, of from 0.01 mm to 10 mm. In another embodiment, the edge exclusion material 14 has a width of from 0.1 mm to 5 mm. It is observed that the portion of the base substrate 10 that is located directly beneath the edge exclusion material 14 defines an edge exclusion region whose presence minimizes the edge related breakage during a subsequent spalling process.

Figure 3:
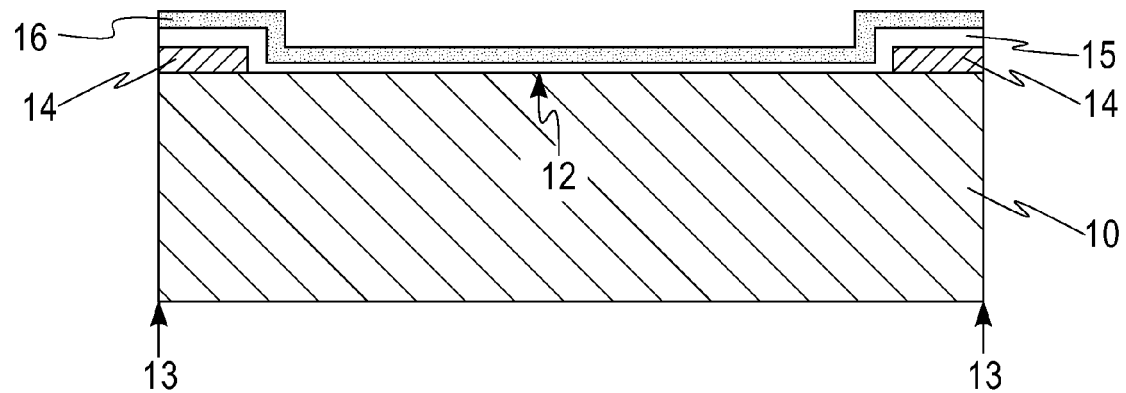
FIG. 3 is a pictorial representation (though a cross sectional view) illustrating the structure of FIG. 2 after forming an optional metal-containing adhesion layer and a stressor layer atop the base substrate.

Referring to FIG. 3, there is illustrated the structure of FIG. 2 after forming an optional metal-containing adhesion layer 15 and a stressor layer 16 atop the upper surface 12 of the base substrate 10. As shown, portions of the optional metal-containing adhesion layer 15 and portions of stressor layer 16 are formed atop edge exclusion material 14.

The optional metal-containing adhesion layer 15 can be employed in embodiments in which the stressor layer 16 to be subsequently formed has poor adhesion to the material of the base substrate 10. Typically, the optional metal-containing adhesion layer 15 is employed when a stressor layer comprised of a metal is employed. The optional metal-containing adhesion layer 15 that can be employed in the present disclosure includes any metal adhesion material such as, but not limited to, Ti/W, Ti, Cr, Ni or any combination thereof. The optional metal-containing adhesion layer 15 may comprise a single layer or it may include a multilayered structure comprising at least two layers of different metal adhesion materials.

The optional metal-containing adhesion layer 15 can be formed at room temperature (15° C.-40° C.) or above. In one embodiment, the optional metal-containing adhesion layer 15 is formed at a temperature which is from 20° C. to 180° C. In another embodiment, the optional metal-containing adhesion layer 15 is formed at a temperature which is from 20° C. to 60° C.

The optional metal-containing adhesion layer 15 can be formed utilizing deposition techniques that are well known to those skilled in the art. For example, the optional metal-containing adhesion layer 15 can be formed by sputtering, chemical vapor deposition, plasma enhanced chemical vapor deposition, chemical solution deposition, physical vapor deposition, and plating. When sputter deposition is employed, the sputter deposition process may further include an in-situ sputter clean process before the deposition.

When employed, the optional metal-containing adhesion layer 15 typically has a thickness of from 5 nm to 200 nm, with a thickness of from 100 nm to 150 nm being more typical. Other thicknesses for the optional metal-containing adhesion layer 15 that are below and/or above the aforementioned thickness ranges can also be employed in the present disclosure.

As mentioned above, stressor layer 16 is located atop the upper surface 12 of base substrate 10 and atop the edge exclusion material 14. In one embodiment and when no metal-containing adhesion layer is present, the stressor layer is in direct contact with the upper surface 12 of base substrate 10 and atop the edge exclusion material 14. In another embodiment and when a metal-containing adhesion layer is present, the stressor layer is in direct contact with the upper surface of the metal-containing adhesion layer.

In accordance with the present disclosure, the stressor layer 16 that is formed atop upper surface 12 of base substrate 10 has a critical thickness and stress value that cause spalling mode fracture to occur within the base substrate 10. By "spalling mode fracture" it is meant that a crack is formed within base substrate 10 and the combination of loading forces maintain a crack trajectory at a depth below the stressor/substrate interface. By critical condition, it is meant that for a given stressor material and substrate material combination, a thickness value and a stressor value for the stressor layer is chosen that render spalling mode fracture possible (can produce a $K_I$ value greater than the $K_{IC}$ of the substrate).

Specifically, the thickness of the stressor layer 16 is chosen to provide the desired fracture depth within the base substrate 10. For example, if the stressor layer 16 is chosen to be Ni, then fracture will occur at a depth below the stressor layer 16 roughly 2 to 3 times the Ni thickness. The stress value for the stressor layer 16 is then chosen to satisfy the critical condition for spalling mode fracture. This can be estimated by inverting the empirical equation given by $t^* = \{(2.5 \times 10^6 (K_{IC}^{3/2})] / \sigma^2$, where $t^*$ is the critical stressor layer thickness (in microns), $K_{IC}$ is the fracture toughness (in units of MPa·m$^{1/2}$) of the base substrate 10 and $\sigma$ is the stress value of the stressor layer (in MPa or megapascals). The above expression is a guide, in practice, spalling can occur at stress or thickness values up to 20% less than that predicted by the above expression.

In accordance with the present disclosure, the stressor layer 16 is under tensile stress while present on the base substrate 10 at the spalling temperature. Illustrative examples of materials that can be employed as the stressor layer 16 include, but are not limited to, a metal, a polymer, such as a spall inducing tape layer, or any combination thereof. The stressor layer 16 may comprise a single stressor layer, or a multilayered stressor structure including at least two layers of different stressor material can be employed.

In one embodiment, the stressor layer 16 is composed of a metal. In another embodiment, the stressor layer 16 is composed of a polymer. In yet another embodiment, the stressor layer 16 is composed of a spall inducing tape. In another embodiment, for example, the stressor layer 16 may comprise a two-part stressor layer including a lower part and an upper part. The upper part of the two-part stressor layer can be comprised of a spall inducing tape layer.

When a metal is employed as the stressor layer 16, the metal can include, for example, Ni, Ti, Cr, Fe or W. Alloys of these metals can also be employed. In one embodiment, the stressor layer 16 includes at least one layer consisting of Ni.

When a polymer is employed as the stressor layer 16, the polymer is a large macromolecule composed of repeating structural units. These subunits are typically connected by covalent chemical bonds. Illustrative examples of polymers that can be employed as the stressor layer 16 include, but are not limited to, polyimides, polyesters, polyolefins, polyacrylates, polyurethane, polyvinyl acetate, and polyvinyl chloride.

When a spall inducing tape layer is employed as the stressor layer 16, the spall inducing tape layer includes any pressure sensitive tape that is flexible, soft, and stress free at the temperature used to form the tape, yet strong, ductile and tensile at the temperature used during spalling. By "pressure sensitive tape," it is meant an adhesive tape that will stick with application of pressure, without the need for solvent, heat, or water for activation. Tensile stress in the tape at the spalling temperature is primarily due to thermal expansion mismatch between the base substrate 10 (with a lower thermal coefficient of expansion) and the tape (with a higher thermal expansion coefficient).

Typically, the pressure sensitive tape that is employed in the present disclosure as stressor layer 16 includes at least an adhesive layer and a base layer. Materials for the adhesive layer and the base layer of the pressure sensitive tape include polymeric materials such as, for example, acrylics, polyesters, olefins, and vinyls, with or without suitable plasticizers. Plasticizers are additives that can increase the plasticity of the polymeric material to which they are added.

In one embodiment, the stressor layer 16 employed in the present disclosure are formed at a temperature which is at room temperature (15° C.-40° C.). In another embodiment, when a tape layer is employed, the tape layer can be formed at a temperature which is from 15° C. to 60° C.

When the stressor layer 16 is comprised of a metal or polymer, the stressor layer 16 can be formed utilizing deposition techniques that are well known to those skilled in the art including, for example, dip coating, spin-coating, brush coating, sputtering, chemical vapor deposition, plasma enhanced chemical vapor deposition, chemical solution deposition, physical vapor deposition, and plating.

When the stressor layer 16 is comprised of a spall inducing tape layer, the tape layer can be applied by hand or by mechanical means to the structure. The spall inducing tape can be formed utilizing techniques well known in the art or the tape can be commercially purchased from any well known adhesive tape manufacturer. Some examples of spall inducing tapes that can be used in the present disclosure as the stressor layer include, for example, Nitto Denko 3193MS thermal release tape, Kapton KPT-1, and Diversified Biotech's CLEAR-170 (acrylic adhesive, vinyl base).

In one embodiment, a two-part stressor layer can be formed on atop the upper surface 12 of base substrate 10, wherein a lower part of the two-part stressor layer is formed at a first temperature which is at room temperature or slight above (e.g., from 15° C. to 60° C.), wherein an upper part of the two-part stressor layer comprises a spall inducing tape layer formed at an auxiliary temperature which is at room temperature.

If the stressor layer 16 is of a metallic nature, it typically has a thickness of from 3 µm to 50 µm, with a thickness of from 4 µm to 8 µm being more typical. Other thicknesses for a metallic stressor layer that are below and/or above the aforementioned thickness ranges can also be employed in the present disclosure.

If the stressor layer 16 is of a polymeric nature, it typically has a thickness of from 10 µm to 200 µm, with a thickness of from 50 µm to 100 µm being more typical. Other thicknesses for a polymeric stressor layer that are below and/or above the aforementioned thickness ranges can also be employed in the present disclosure.

Figure 4:
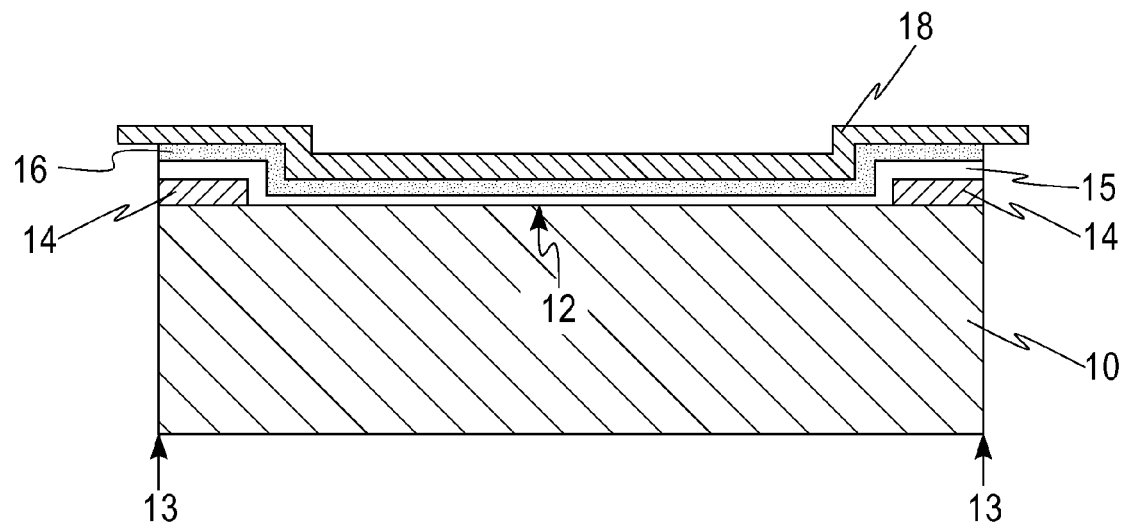
FIG. 4 is a pictorial representation (though a cross sectional view) illustrating the structure of FIG. 3 after forming an optional handle substrate atop the stressor layer.

Referring to FIG. 4, there is illustrated the structure of FIG. 2 after forming an optional handle substrate 18 on the stressor layer 16. The optional handle substrate 18 employed in the present disclosure comprises any flexible material which has a minimum radius of curvature of less than 30 cm. Illustrative examples of flexible materials that can be employed as the optional handle substrate 18 include a metal foil or a polyimide foil. Other examples of flexible materials that can be employed as the optional handle substrate 18 include polymers, tapes and spin-on materials.

The optional handle substrate 18 can be used to provide better fracture control and more versatility in handling the spalled portion of the base substrate 10. Moreover, the optional handle substrate 18 can be used to guide the crack propagation during the spalling process of the present disclosure. The optional handle substrate 18 of the present disclosure is typically, but not necessarily, formed at room temperature (15° C.-40° C.).

The optional handle substrate 18 can be formed utilizing deposition techniques that are well known to those skilled in the art including, for example, dip coating, spin-coating, brush coating, sputtering, chemical vapor deposition, plasma enhanced chemical vapor deposition, chemical solution deposition, physical vapor deposition, and plating.

The optional handle substrate 18 typical has a thickness of from 1 µm to few mm, with a thickness of from 70 µm to 120 µm being more typical. Other thicknesses for the optional handle substrate 18 that are below and/or above the aforementioned thickness ranges can also be employed in the present disclosure.

Figure 5:
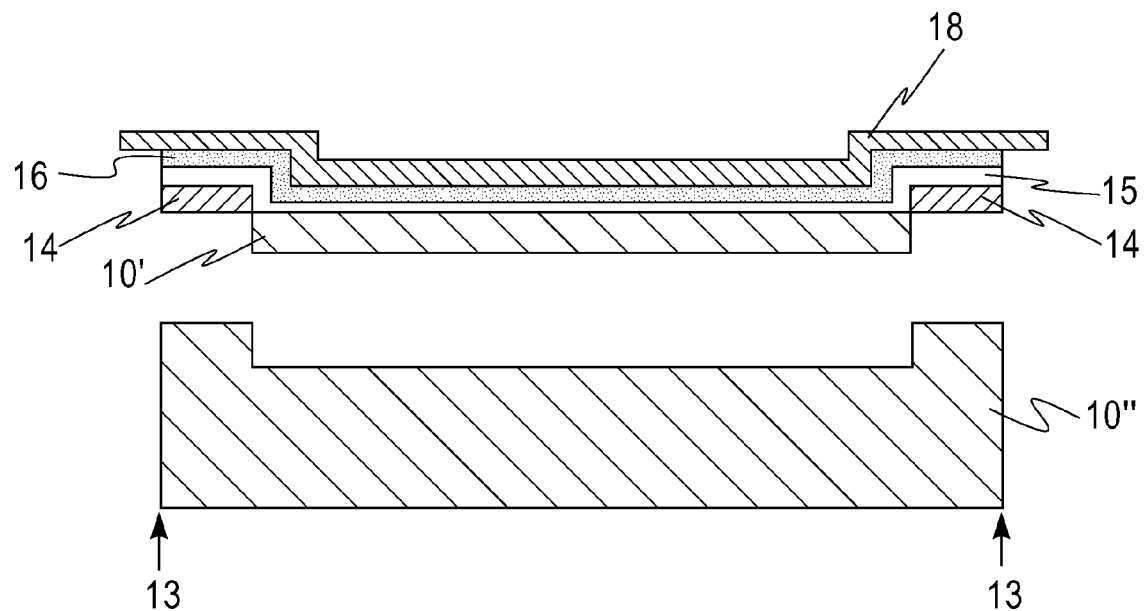
FIG. 5 is a pictorial representation (though a cross sectional view) illustrating the structure of FIG. 4 after spalling the base substrate.

Referring to FIG. 5, there is illustrated the structure of FIG. 4 after spalling in which a portion of the base substrate is removed from the initial base substrate. The portion of the base substrate that is removed from the initial base substrate is referred to herein as spalled portion 10'; the remaining portion of the base substrate is designated as 10" in FIG. 5.

The spalling process can be initiated at room temperature or at a temperature that is less than room temperature. In one embodiment, spalling is performed at room temperature (i.e., 20° C. to 40° C.). In another embodiment, spalling is performed at a temperature less than 20° C. In a further embodiment, spalling occurs at a temperature of 77 K or less. In an even further embodiment, spalling occurs at a temperature of less than 206 K. In still yet another embodiment, spalling occurs at a temperature from 175 K to 130 K.

When a temperature that is less than room temperature is used, the less than room temperature spalling process can be achieved by cooling the structure down below room temperature utilizing any cooling means. For example, cooling can be achieved by placing the structure in a liquid nitrogen bath, a liquid helium bath, an ice bath, a dry ice bath, a supercritical fluid bath, or any cryogenic environment liquid or gas.

When spalling is performed at a temperature that is below room temperature, the spalled structure is returned to room temperature by allowing the spalled structure to slowly cool up to room temperature by allowing the same to stand at room temperature. Alternatively, the spalled structure can be heated up to room temperature utilizing any heating means.

Figure 6:
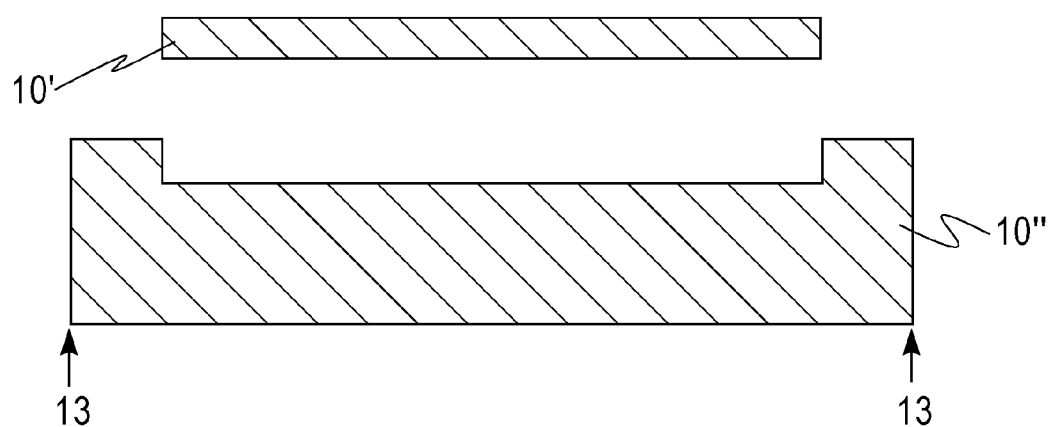
FIG. 6 is a pictorial representation (though a cross sectional view) illustrating the structure of FIG. 5 after removing the handle substrate, the stressor layer, the optional metal adhesion layer and the edge exclusion material from a spalled portion of the base substrate.

Referring to FIG. 6, there is illustrated the structure of FIG. 5 after removing optional handle substrate 18, the stressor layer 16 and, if present optional metal-containing adhesion layer 15, and the edge exclusion material 14 from a spalled portion 10' of the base substrate.

The optional handle substrate 18, the stressor layer 16, the optional metal-containing adhesion layer 15 and the edge exclusion material 14 can be removed from the spalled portion 10' of the base substrate utilizing conventional techniques well known to those skilled in the art. For example, and in one embodiment, aqua regia ($HNO_3$/HCl) can be used for removing the optional handle substrate 18, the stressor layer portion 16A, the optional metal-containing adhesion layer, and the edge exclusion material 14 from the spalled portion 10' of the base substrate. In another example, UV or heat treatment is used to remove the optional handle substrate 18, followed by a chemical etch to remove the stressor layer 16, followed by a different chemical etch to remove the optional metal-containing adhesion layer 15, followed by organic solvent such as acetone to remove the edge exclusion material layer 14.

The thickness of the spalled portion 10' of the base substrate shown in FIG. 6 varies depending on the material of the stressor layer 16 and the material of the base substrate 10 itself. In one embodiment, the spalled portion 10' of the base substrate has a thickness of less than 100 microns. In another embodiment, the spalled portion 10' of the base substrate has a thickness of less than 50 microns.

Referring now to FIGS. 7-11, there is illustrated another embodiment of the present disclosure in which an edge exclusion region is formed on the upper surface of the base substrate by removing portions of a blanket stressor layer from the upper surface of the base substrate 10 which are near edges 13.

Figure 7:
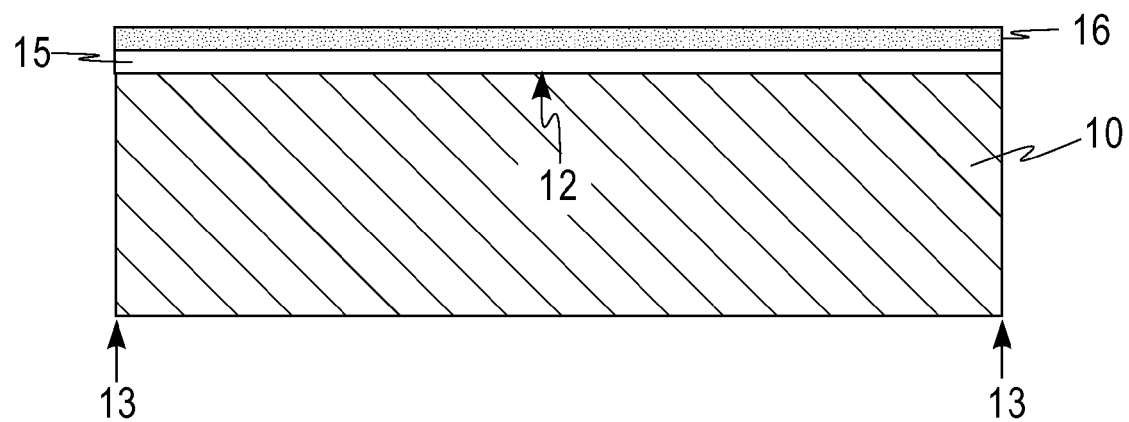
FIG. 7 is a pictorial representation (though a cross sectional view) illustrating the structure of FIG. 1 after forming an optional metal-containing adhesion layer and a stressor layer atop the base substrate.

Referring first to FIG. 7, there is illustrated the structure of FIG. 1 after forming an optional metal-containing adhesion layer 15 and a stressor layer 16 atop the upper surface 12 of base substrate 10. The base substrate 10, the optional metal-containing adhesion layer 15 and a stressor layer 16 employed in this embodiment of the present disclosure include materials mentioned above in the other embodiment of the present disclosure.

Figure 8:
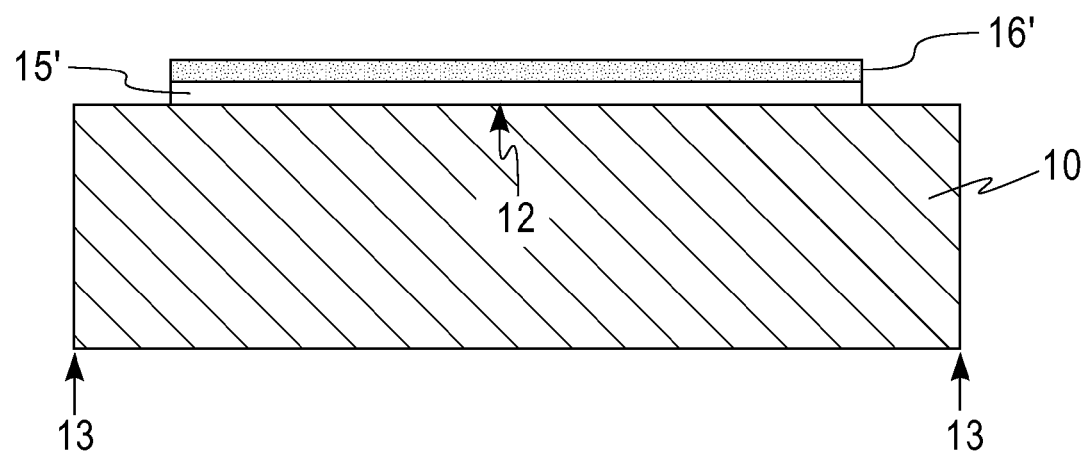
FIG. 8 is a pictorial representation (though a cross sectional view) illustrating the structure of FIG. 7 after removing the stressor layer and the optional metal-containing adhesion layer from portions of the upper surface of the base substrate that are near the edges.

Referring to FIG. 8, there is illustrated the structure of FIG. 7 after removing the stressor layer 16 and the optional metal-containing adhesion layer 15 from portions of the upper surface 12 of the base substrate 10 that are near the edges 13. In FIG. 8, reference numeral 16' denotes a patterned stressor layer and reference numeral 15' denotes a patterned optional metal-containing adhesion layer. The patterning of the stressor layer 16 and the optional metal-containing adhesion layer 15 can be achieved by lithography and etching. Lithography includes applying a photoresist (not shown) atop the stressor layer, exposing the photoresist to a desired pattern of radiation and developing the exposed photoresist utilizing a conventional resist developer. The etching process includes a dry etching process (such as, for example, reactive ion etching, ion beam etching, plasma etching or laser ablation), and/or a wet chemical etching process. Typically, reactive ion etching is used in removing the stressor layer 16 and the optional metal-containing adhesion layer 15 from portions of the upper surface 12 of the base substrate 10 that are near the edges 13. The patterned photoresist can be removed by an ashing step.

In this embodiment of the present disclosure, the exposed portions of the base substrate near the edges 13 have a width that is within the range mentioned above for the edge exclusion material 14. It is observed that the exposed portions of the base substrate 10 that are not covered by at least the patterned stressor layer 16' defines an edge exclusion region whose presence minimizes the edge related breakage during a subsequent spalling process.

In some embodiment of the present disclosure, the structure shown in FIG. 8 can be formed without first forming the structure shown in FIG. 7. In such an embodiment, a patterned mask can be formed on portions of the upper surface 12 of the base substrate 10 that are near the edges 13, and then the optional metal-containing adhesion layer and the stressor layer can be selectively formed only atop exposed portions of the upper surface of the base substrate. Following the selective formation of the optional metal-containing adhesion layer and the stressor layer, the patterned mask can be removed from the structure utilizing a selective etching process.

In one embodiment, the patterned mask can be comprised of any masking material that prevents deposition of optional metal-containing adhesion layer or stressor layer from occurring, including, but not limited to, metals, plastics or ceramics. The patterned mask can be a sheet of material with an aperture that prevents deposition in the edge exclusion region. An etching process may, or may not be used to remove portions of the masking material that are not located near edges 13.

Figure 9:
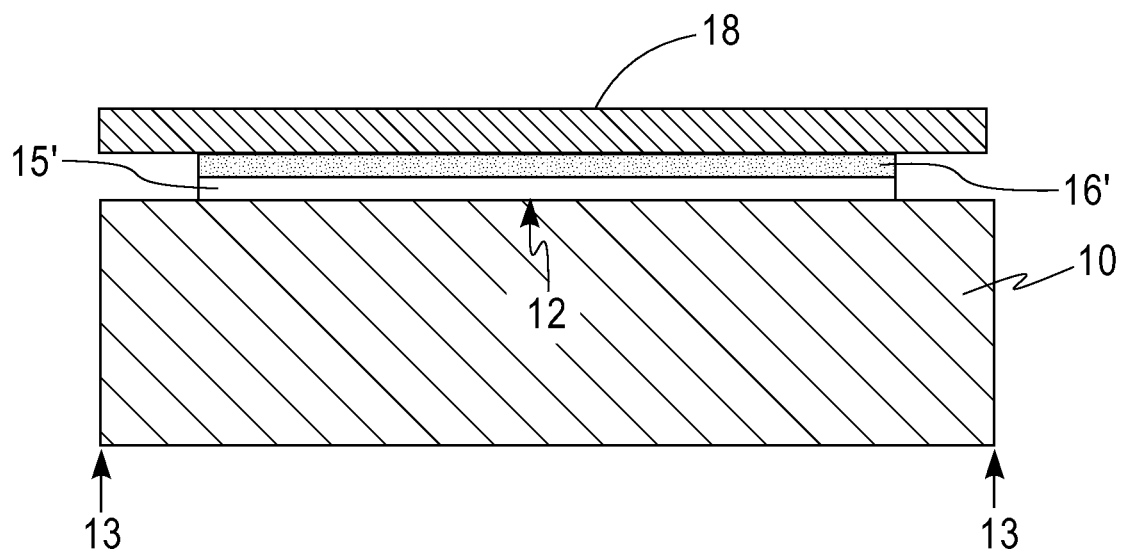
FIG. 9 is a pictorial representation (though a cross sectional view) illustrating the structure of FIG. 8 after forming an optional handle substrate atop the patterned stressor layer and the patterned optional metal-containing adhesion layer.

Referring to FIG. 9, there is illustrated the structure of FIG. 8 after forming an optional handle substrate 18 atop the patterned stressor layer 16' and the patterned optional metal-containing adhesion layer 15'. The optional handle substrate 18 employed in this embodiment of the present disclosure is the same as the optional handle substrate employed in the previous embodiment of the present disclosure.

Figure 10:
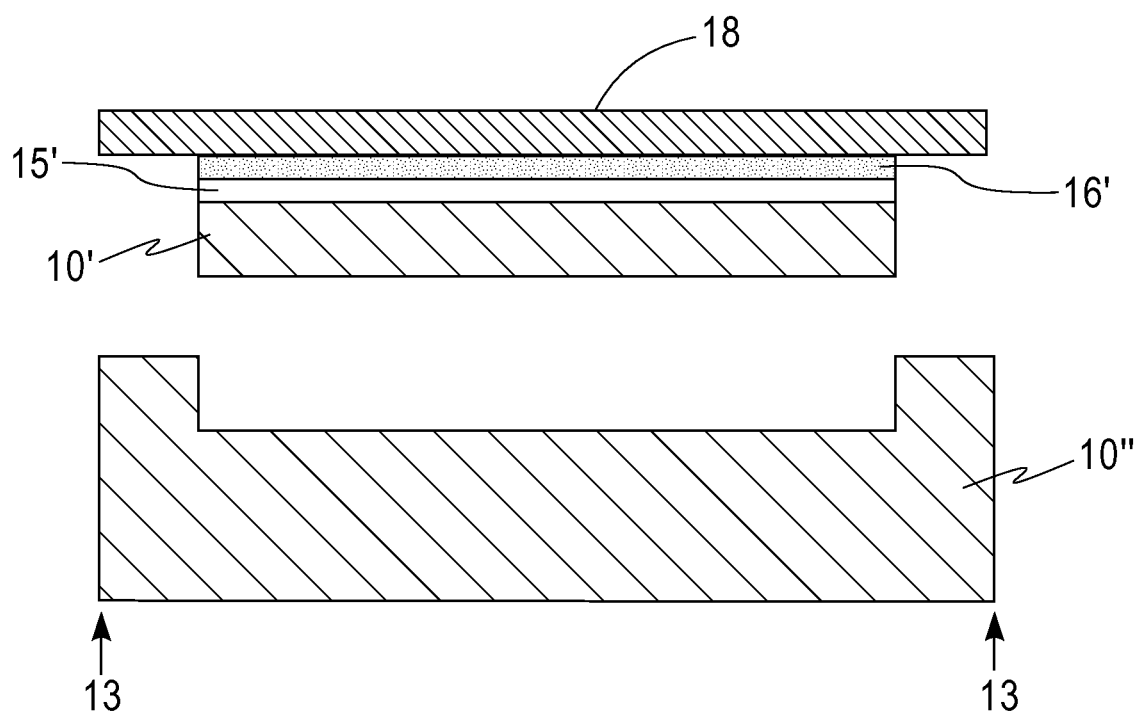
FIG. 10 is a pictorial representation (though a cross sectional view) illustrating the structure of FIG. 9 after spalling the base substrate.

Referring to FIG. 10, there is illustrated the structure of FIG. 9 after spalling the base substrate. The spalling process employed in this embodiment of the present disclosure is the same as that described in the previous embodiment of the present disclosure. In FIG. 10, reference numeral 10' denotes a spalled portion of the base substrate; the remaining portion of the base substrate is designated as 10" in FIG. 10.

Figure 11:
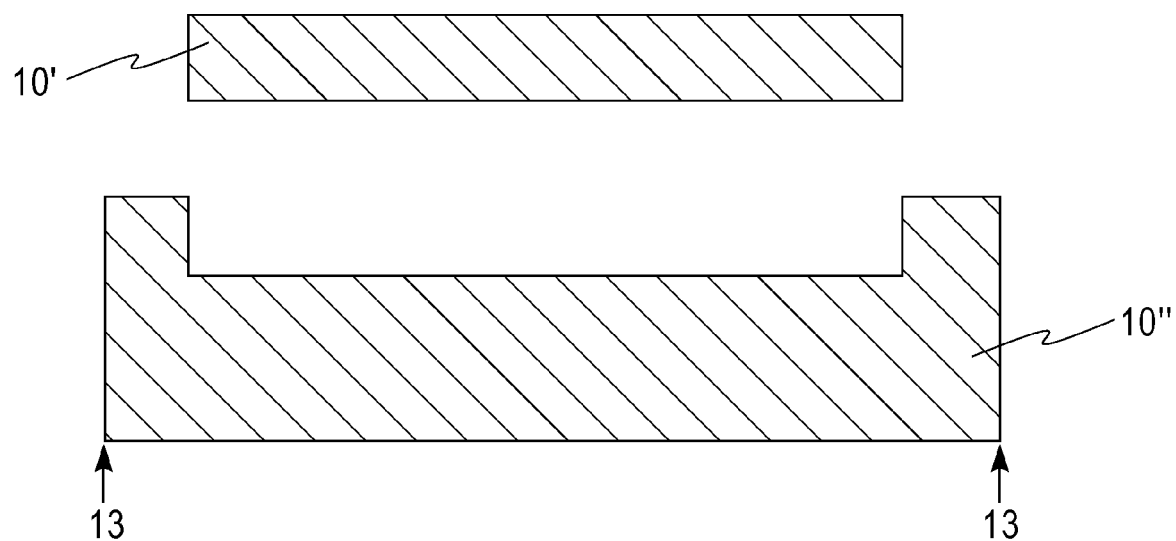
FIG. 11 is a pictorial representation (though a cross sectional view) illustrating the structure of FIG. 12 after removing the handle substrate, the patterned stressor layer and the patterned optional metal-containing adhesion layer from a spalled portion of the base substrate.

Referring to FIG. 11, there is illustrated the structure of FIG. 10 after removing the optional handle substrate 18, the patterned stressor layer 16' and the patterned optional metal-containing adhesion layer 15' from the spalled portion 10' of the base substrate. The removal of the optional handle substrate 18, the patterned stressor layer 16' and the patterned optional metal-containing adhesion layer 15' from the spalled portion 10' of the base substrate is the same as that described in the previous embodiment of the present disclosure.

While the present disclosure has been particularly shown and described with respective to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method for removing a material layer from a base substrate comprising:
    forming an edge exclusion material on an upper surface and near edges of a base substrate, but not an entirety of said upper surface of said base substrate;
    forming a stressor layer on exposed portions of the upper surface of the base substrate and atop the edge exclusion material; and
    spalling a portion of the base substrate that is located beneath the stressor layer and which is not covered with said edge exclusion material.

2. The method of claim 1, wherein the base substrate has a fracture toughness that is less than the stressor layer.

3. The method of claim 2, wherein the base substrate comprises a semiconductor material.

4. The method of claim 1, wherein the stressor layer has a critical thickness and stress value that causes spalling mode fracture to occur in a portion of the base substrate that is located beneath the stressor layer and which is not covered with said edge exclusion material.

5. The method of claim 1, further comprising forming a metal-containing adhesion layer between the stressor layer and the base substrate.

6. The method of claim 1, wherein the stressor layer comprises a metal, a polymer, a spalling inducing tape or any combination thereof.

7. The method of claim 1, further comprises forming a handle substrate atop the stressor layer.

8. The method of claim 1, wherein the spalling is performed at room temperature or below room temperature.

9. The method of claim 1, wherein the spalling is performed at a temperature of 77 K or less.

10. The method of claim 1, further comprising removing the stressor layer and the edge exclusion material from the spalled portion of the base substrate.

11. The method of claim 1, wherein said removing includes contacting the stressor layer and the edge exclusion material with a chemical etchant.

12. The method of claim 1, wherein said edge exclusion material comprises a photoresist material, a polymer, a hydrocarbon material, an ink, a metal, or a paste.

13. A method for removing a material layer from a base substrate comprising:
applying ink to an upper surface and near edges of a base substrate, but not an entirety of said upper surface of the base substrate;
forming a stressor layer on exposed portions of the upper surface of the base substrate and atop the ink; and
spalling a portion of the base substrate that is located beneath the stressor layer and which is not covered with said ink.

14. The method of claim 13, wherein said applying said ink comprise felt tip application.

15. The method of claim 13, wherein said applying said ink comprises utilizing a pen or a marker.

16. The method of claim 13, wherein said ink is an alcohol-based ink or a water-based ink.

17. The method of claim 13, wherein the base substrate has a fracture toughness that is less than the stressor layer.

18. The method of claim 17, wherein the base substrate comprises a semiconductor material.

19. The method of claim 13, wherein the stressor layer has a critical thickness and stress value that causes spalling mode fracture to occur in a portion of the base substrate that is located beneath the stressor layer and which is not covered with said edge exclusion material.

20. The method of claim 13, further comprising forming a metal-containing adhesion layer between the stressor layer and the base substrate.

21. The method of claim 13, wherein the stressor layer comprises a metal, a polymer, a spalling inducing tape or any combination thereof.

22. The method of claim 13, further comprises forming a handle substrate atop the stressor layer.

23. The method of claim 13, wherein the spalling is performed at room temperature or below room temperature.

* * * * *